United States Patent
Tanimoto et al.

(10) Patent No.: US 9,081,664 B2
(45) Date of Patent: Jul. 14, 2015

(54) MEMORY SYSTEM CAPABLE OF PREVENTING DATA DESTRUCTION

(71) Applicants: Shingo Tanimoto, Yokohama (JP); Hidetaka Tsuji, Yokohama (JP)

(72) Inventors: Shingo Tanimoto, Yokohama (JP); Hidetaka Tsuji, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 209 days.

(21) Appl. No.: 13/686,161

(22) Filed: Nov. 27, 2012

(65) Prior Publication Data
US 2014/0047162 A1    Feb. 13, 2014

Related U.S. Application Data

(60) Provisional application No. 61/681,806, filed on Aug. 10, 2012.

(51) Int. Cl.
*G06F 12/00*  (2006.01)
*G06F 12/02*  (2006.01)

(52) U.S. Cl.
CPC ............ *G06F 12/0246* (2013.01); *G06F 12/02* (2013.01); *G06F 2212/7211* (2013.01)

(58) Field of Classification Search
CPC .................. G06F 12/0246; G06F 2212/7211; G06F 11/076; G11C 8/04
USPC ................................ 711/103; 365/185.01–33
See application file for complete search history.

(56) References Cited

U.S. PATENT DOCUMENTS

| | | | | |
|---|---|---|---|---|
| 6,768,673 | B1 * | 7/2004 | Hsia et al. | 365/185.03 |
| 7,193,896 | B2 * | 3/2007 | Shiga | 365/185.09 |
| 7,257,032 | B2 * | 8/2007 | Fujiu et al. | 365/185.24 |
| 7,734,861 | B2 * | 6/2010 | Li et al. | 711/103 |
| 7,941,592 | B2 * | 5/2011 | Bonella et al. | 711/103 |
| 8,001,317 | B2 * | 8/2011 | Yeh et al. | 711/103 |
| 8,161,230 | B2 * | 4/2012 | Kudo et al. | 711/103 |
| 8,307,172 | B2 * | 11/2012 | Ito | 711/156 |
| 8,327,063 | B2 * | 12/2012 | Shiga et al. | 711/103 |

(Continued)

FOREIGN PATENT DOCUMENTS

| | | |
|---|---|---|
| JP | 10-106276 | 4/1998 |
| JP | 2006-294126 | 10/2006 |

(Continued)

OTHER PUBLICATIONS

Fleming, P.Algorithm for adjustment of DDR write interface timing. Jun. 2008. IET. Signals and Systems Conference 208. p. 144-148.*

*Primary Examiner* — Jared Rutz
*Assistant Examiner* — Khoa Doan
(74) *Attorney, Agent, or Firm* — Oblon, McClelland, Maier & Neustadt, L.L.P.

(57) ABSTRACT

According to one embodiment, a memory system includes a memory unit, a first controller, and a second controller. In the memory unit, first to fourth levels (first level<second level<third level<fourth level) are written based on first and second data. The first controller comprises a first write mode of writing the fourth level based on the data of the second page and then writing the second and third levels and a second write mode of writing the third and fourth levels and then writing the second level. The second controller issues at least one of second and third commands to be supplied to the first controller in order to select at least one of the first and second write modes.

20 Claims, 13 Drawing Sheets

(56) References Cited

U.S. PATENT DOCUMENTS

| | | | |
|---|---|---|---|
| 8,468,294 B2* | 6/2013 | Huang et al. | 711/103 |
| 8,484,430 B2* | 7/2013 | Ito | 711/170 |
| 8,706,950 B2* | 4/2014 | Yano et al. | 711/103 |
| 2005/0207220 A1* | 9/2005 | Takeuchi | 365/185.03 |
| 2006/0227624 A1 | 10/2006 | Shiga | |
| 2007/0133277 A1* | 6/2007 | Kawai et al. | 365/185.03 |
| 2008/0094894 A1* | 4/2008 | Hayakawa | 365/185.03 |
| 2008/0126683 A1* | 5/2008 | Tsuji | 711/103 |
| 2008/0250220 A1* | 10/2008 | Ito | 711/173 |
| 2009/0073763 A1* | 3/2009 | Hosono | 365/185.03 |
| 2011/0029726 A1 | 2/2011 | Fujimoto | |
| 2012/0002470 A1* | 1/2012 | Futatsuyama et al. | 365/185.03 |
| 2012/0155167 A1* | 6/2012 | Uehara | 365/185.03 |
| 2012/0268994 A1* | 10/2012 | Nagashima | 365/185.11 |
| 2012/0284453 A1* | 11/2012 | Hashimoto | 711/103 |
| 2012/0290768 A1* | 11/2012 | Rubowitz | 711/103 |
| 2012/0311244 A1* | 12/2012 | Huang et al. | 711/103 |
| 2013/0332802 A1* | 12/2013 | Hashimoto | 714/773 |
| 2014/0029337 A1* | 1/2014 | Shibata et al. | 365/185.03 |
| 2014/0082266 A1* | 3/2014 | Fujiu | 711/103 |

FOREIGN PATENT DOCUMENTS

| | | |
|---|---|---|
| JP | 2008-108299 | 5/2008 |
| JP | 2009-230407 | 10/2009 |

* cited by examiner

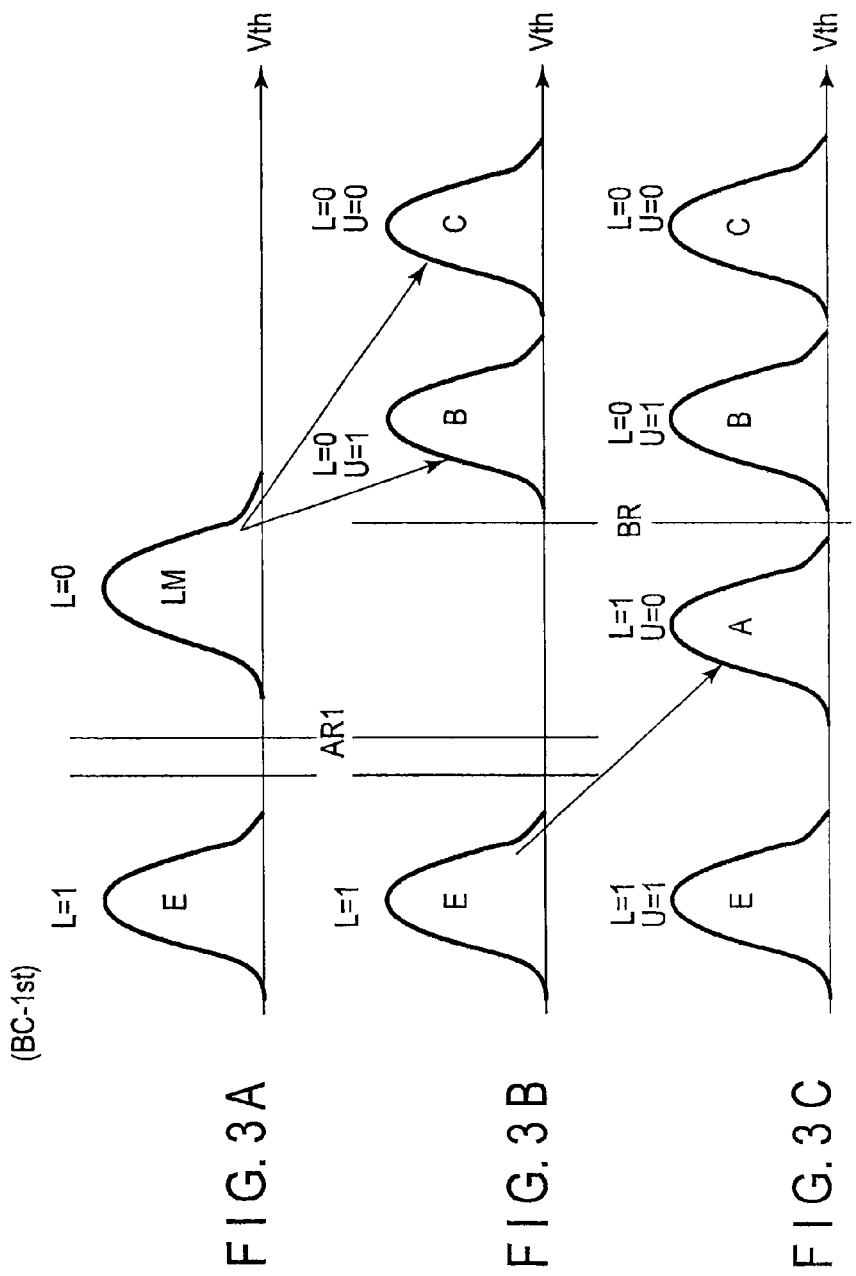

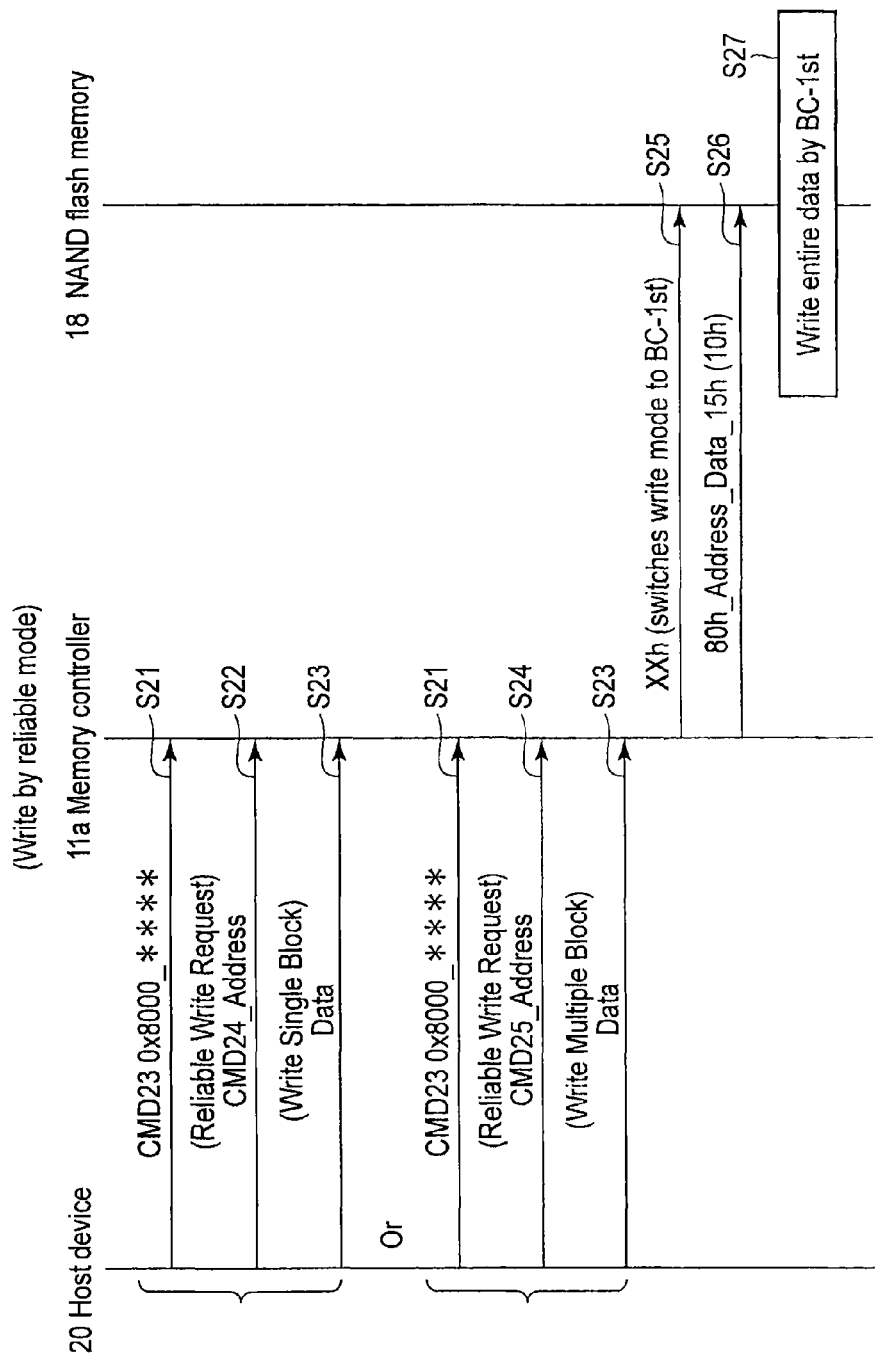
F I G. 5

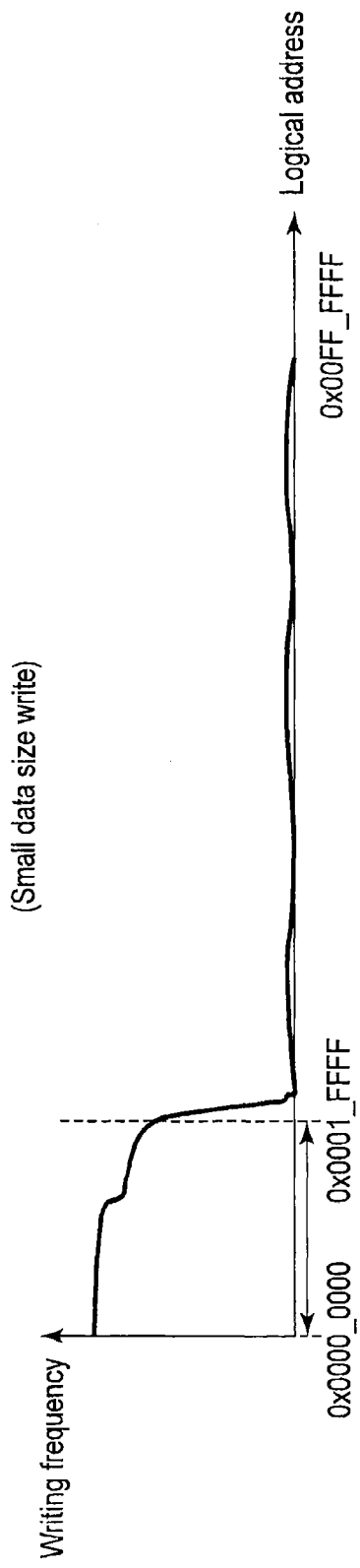
F I G. 10 A
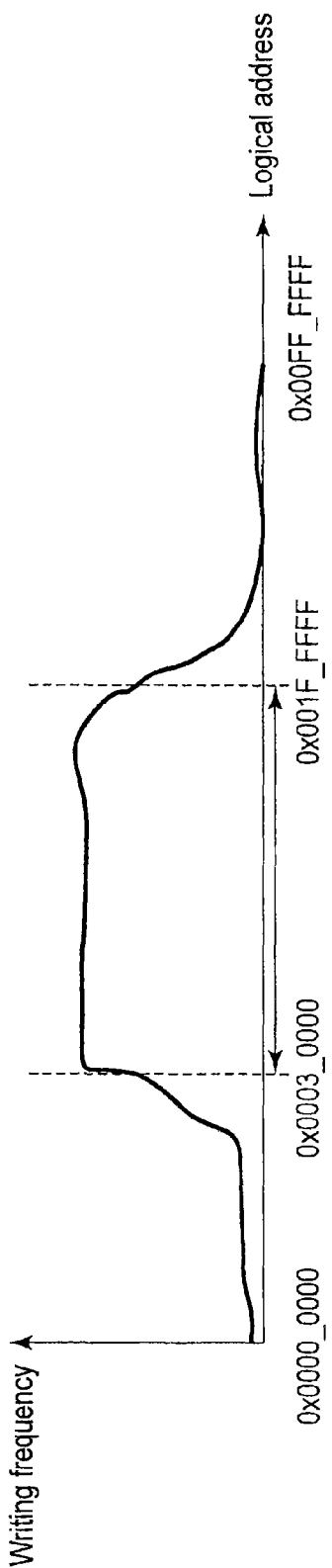
F I G. 10 B

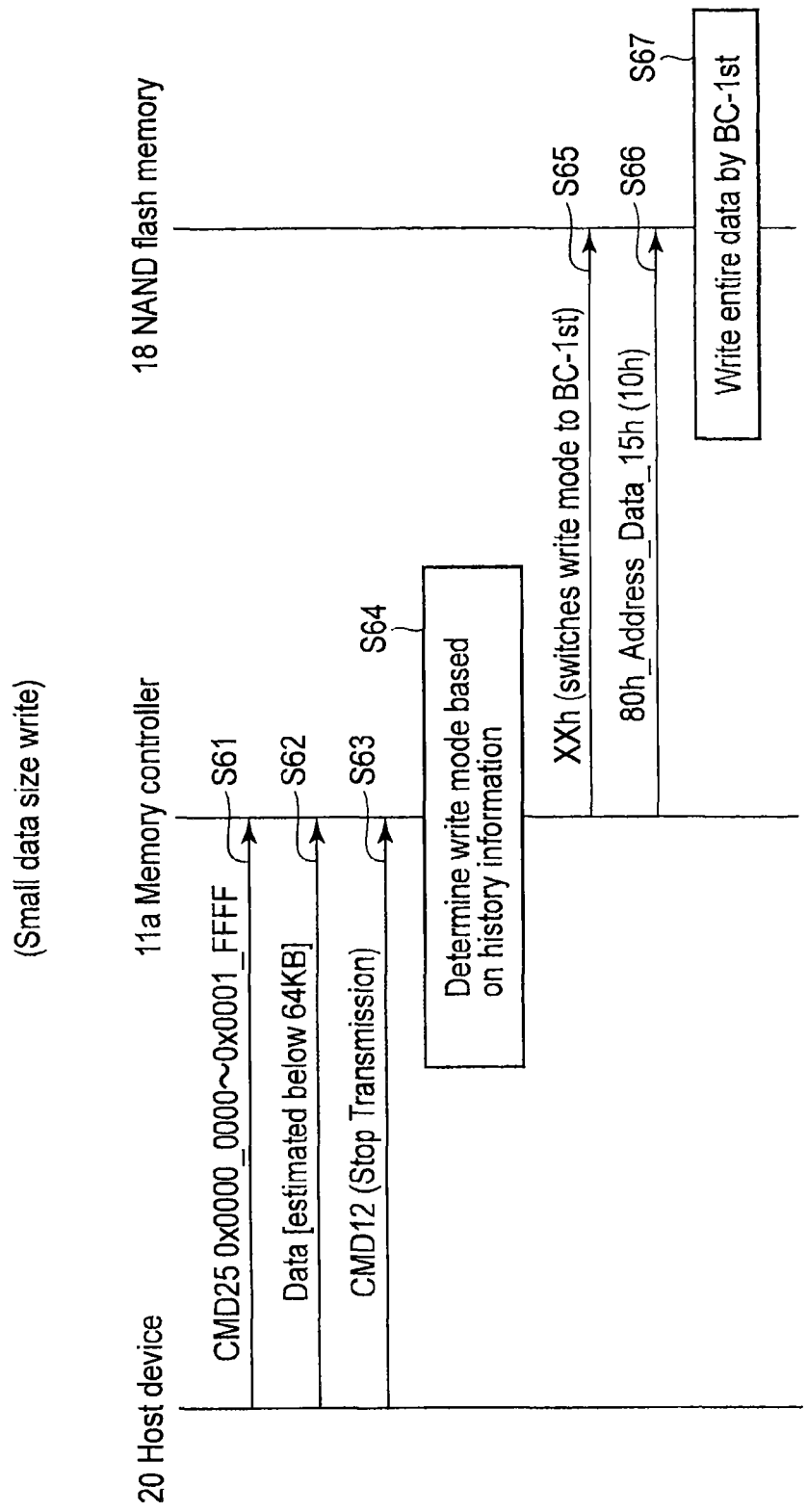
F I G. 11

| L | U |
|---|---|
| 0 | 2 |
| 1 | 4 |
| 3 | 6 |
| 5 | 8 |
| 7 | 10 |
| ⋮ | ⋮ |
| 245 | 248 |
| 247 | 250 |
| 249 | 252 |
| 251 | 254 |
| 253 | 255 |

} Physical sector

F I G. 13

US 9,081,664 B2

1

MEMORY SYSTEM CAPABLE OF PREVENTING DATA DESTRUCTION

CROSS-REFERENCE TO RELATED APPLICATIONS

This application claims the benefit of U.S. Provisional Application No. 61/681,806, filed Aug. 10, 2012, the entire contents of which are incorporated herein by reference.

FIELD

Embodiments described herein relate generally to a memory system using a NAND flash memory, for example.

BACKGROUND

A multi-level NAND flash memory, for example, which is capable of storing a plurality of bits in a memory cell has a lower page and an upper page, for example, wherein data of the lower page are written first, and then data of the upper page are written. When writing the data of the upper page after writing the data of the lower page, the data of the lower page can be destructed in the case where power is turned off or a write defect occurs during the writing.

BRIEF DESCRIPTION OF THE DRAWINGS

FIGS. 3A, 3B, and 3C are diagrams showing another example of mode of writing in a memory cell;

FIG. 5 is a diagram showing a sequence chart of a write operation according to a first modification example of the first embodiment;

FIGS. 10A and 10B are diagrams showing one example of access pattern of a host device according to a third embodiment;

FIG. 11 is a diagram showing a sequence chart of a write operation according to the third embodiment;

FIG. 13 is a diagram showing a specific example of the first embodiment.

DETAILED DESCRIPTION

In general, according to one embodiment, a memory system includes a memory unit, a first controller, and a second controller. In the memory unit, first to fourth levels (first level<second level<third level<fourth level) are written based on first and second data. The first controller comprises a first write mode of writing the fourth level based on the data of the second page and then writing the second and third levels and a second write mode of writing the third and fourth levels and then writing the second level. The second controller issues at least one of second and third commands to be supplied to the first controller in order to select at least one of the first and second write modes.

As a method for preventing destruction of data written into a lower page, the following method has been known.

(1) A method in which data of a lower page are copied to another block serving as a cache region, and, in the case where the data of the lower page are destructed, the data copied to the cache region are written back to the lower page.

(2) A method in which a first memory region which stores single-level data and a second memory region which stores multi-level data are provided in a NAND flash memory; data transferred from a host device are written to the first memory region without exception; and, in the case where data for one block of the data are stored in the first memory region, writing into the second memory region is performed.

The method (1) has problems that a writing speed is slower as compared to an operation of simply writing data into a NAND flash memory and that the number of writings/erasures in the cache region which retains the copied data is increased.

The method (2) requires an operation of transferring data from the first memory region to the second memory region.

From another point of view, a mode of writing into a NAND flash memory in which the destruction of the lower page is prevented by changing a setting order of threshold value distribution contained in the upper page has been proposed. However, the write mode has the problem of a slower writing speed as compared to the ordinary write mode.

Therefore, there has been a demand for a memory system which is capable of preventing the destruction of lower page and the slowdown of writing speed.

Hereinafter, embodiments will be described with reference to the drawings.

Figure 1:
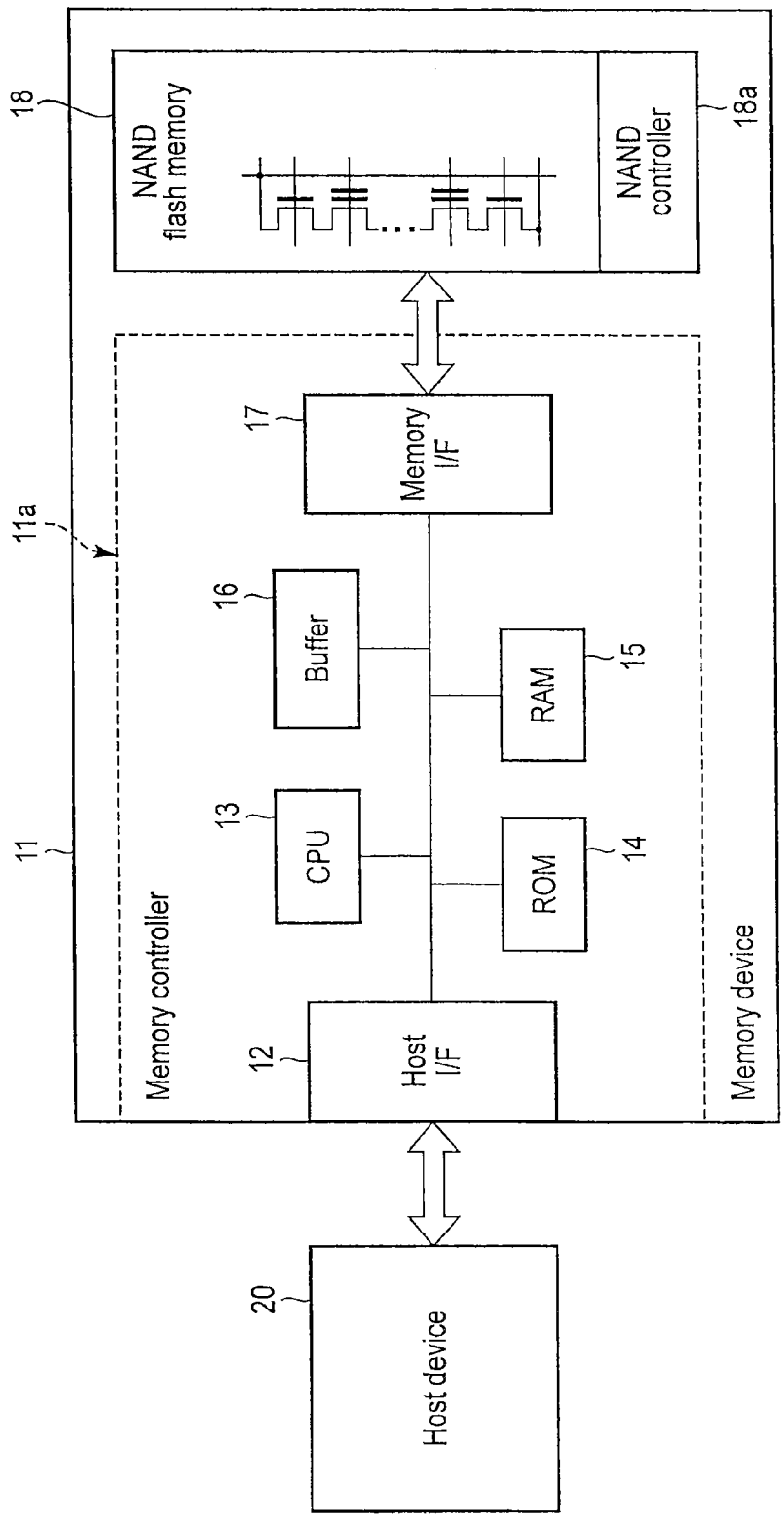
FIG. 1 is a block diagram schematically showing a memory system to which the embodiments are adopted.

FIG. 1 is a diagram schematically showing a memory system to which the present embodiments are adopted.

The memory system includes a memory device 11 such as an SD card and a host device 20.

The memory device 11 operates upon reception of power supply when connected to the host device 20 and performs processing in response to an access from the host device 20. The memory device has a memory controller 11a.

The memory controller 11a includes a host interface (I/F) 12, a CPU 13, a read only memory (ROM) 14, a random access memory (RAM) 15, a buffer 16, and a memory interface (17), for example. These are connected by a bus. A NAND flash memory 18, for example, is connected to the memory interface 17.

The host interface 12 performs interface processing between the memory controller 11a and the host device 20.

The memory interface 17 performs interface processing between the memory controller 11a and the NAND flash memory 18.

The CPU 13 controls an overall operation of the memory device 11. As a program which controls the CPU 13, a firmware (control program or the like) stored in the ROM 14 may be used, or predetermined processing is executed by loading the program from the NAND flash memory 18 to the RAM 15.

More specifically, the CPU 13 accesses a region in the NAND flash memory in response to a write command, a read command, or an erase command from the host device 20 and controls data transfer processing via the buffer 16.

The ROM 14 stores a firmware such as the control program to be used by the CPU 13. The RAM 15 is used as a work area of the CPU 13 and stores the control program and various tables.

The buffer 16 temporarily stores a certain quantity of data (e.g. for one page) in the case of writing data sent from the host device 20 to the NAND flash memory 18, for example, and temporarily stores a certain quantity of data in the case of sending data read out from the NAND flash memory 18 to the host device 20. Further, it is possible to control an SD bus interface and a back-end in an asynchronous manner via the buffer.

The NAND flash memory 18 includes a memory cell having a stacked gate structure or a memory cell having a MONOS structure. The NAND flash memory 18 is capable of storing multi-level data such as 2-bit data in one memory cell.

The NAND flash memory 18 has a NAND controller 18a, and the NAND controller 18a controls write, read, erase, copy, and transfer operations and the like in the NAND flash memory 18. Switching among the operations is enabled by commands supplied from the memory controller 11a.

The NAND flash memory 18 has two write modes as described later in this specification, and switching between the write modes is enabled by a command.

The host device 20 may be a personal computer, a digital camera, a mobile phone, or the like. The host device 20 includes a not-shown host controller, a CPU, a ROM, a RAM, and, for example, a hard disk (including SSD). These are connected by a bus.

The CPU controls the host as a whole. The ROM stores a firmware required for operation of the CPU. The RAM is used as a work area of the CPU, and a program executable by the CPU is loaded to the RAM to be executed. The hard disk retains various data. The host controller performs interface processing with the memory device 11 in a state where the memory device 11 is connected. Further, various commands described later in this specification are issued in accordance with instructions from the CPU.

(Writing Method)

In the case of writing 4-level data, i.e. an E (Erase) level, an A level, a B level, and a C level (E<A<B<C), for example, into memory cells of the NAND flash memory 18, data of a lower page are written first, and then data of an upper page are written.

Methods of writing 4-level data include a C-first (hereinafter abbreviated to C-1st) mode of writing the C level of the upper page first, shown in FIGS. 2A, 2B, 2C, and 2D and a BC first (BC-1st) mode of writing the B level and the C level of the upper page first, shown in FIGS. 3A, 3B, and 3C.

(C-1st Mode)

With the C-1st mode, the data of the lower page are firstly written. More specifically, in the case where the data of the lower page L is "0", a threshold voltage is shifted to a lower middle (LM) level from the E level in the case where the data of the lower page L is "0". The lower middle level (LM) is a substantially intermediate level between the A level which is a final write level and the B level.

Figures 2A, 2B, 2C, 2D:
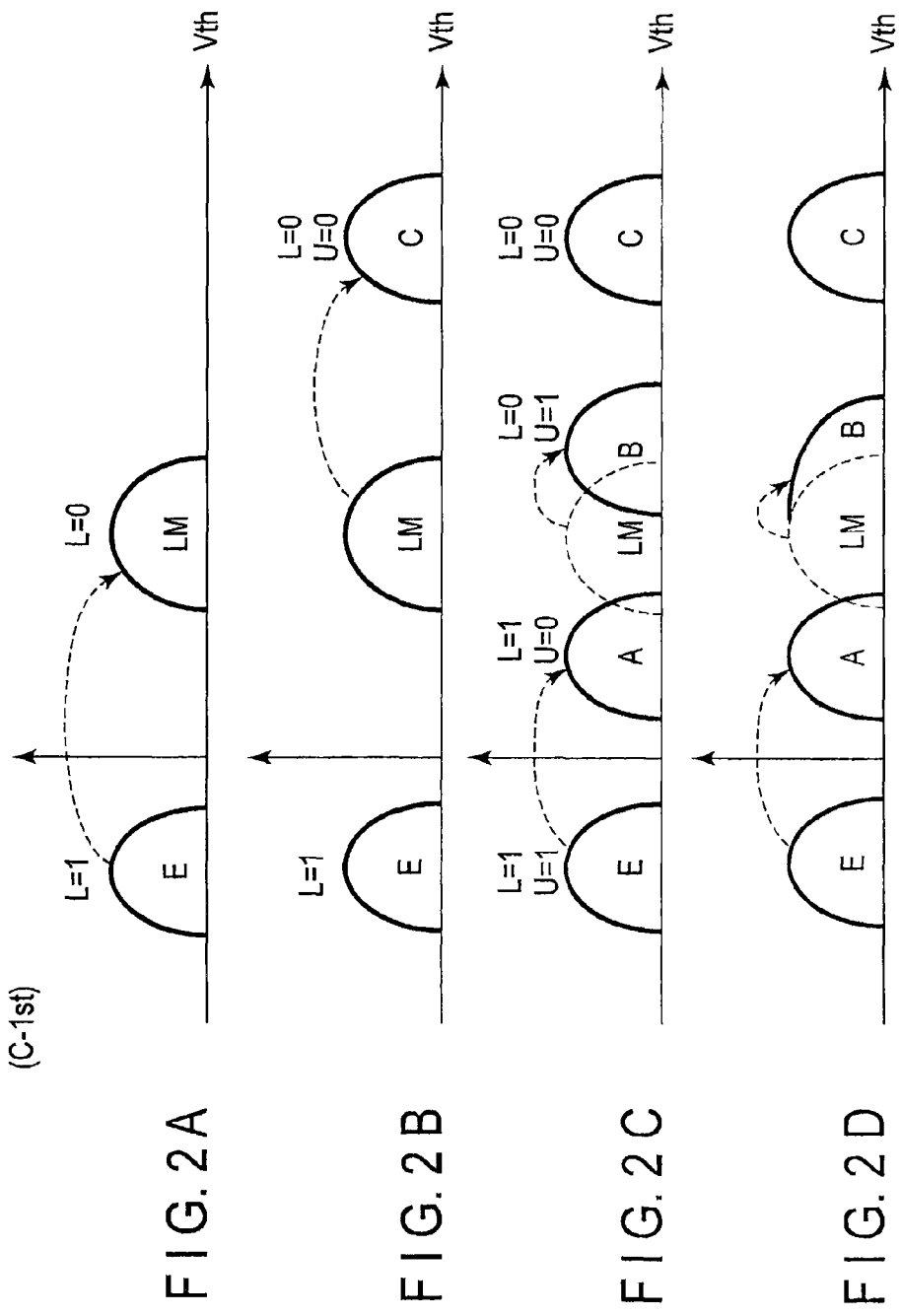
FIGS. 2A, 2B, 2C, and 2D are diagrams showing one example of mode of writing in a memory cell.

In the writing of the upper page, a threshold voltage is firstly shifted from the LM level to the C level as shown in FIG. 2B in the case where the data of the lower page L is "0" and the data of the upper page U is "0".

In the case where the data of the lower page L is "1" and the data of the upper page U is "0" as shown in FIG. 2C, the threshold voltage is shifted from the E level to the A level, while the threshold voltage is shifted from the LM level to the B level in the case where the data of the lower page L is "0" and the data of the upper page U is "1".

The C-1st mode has the problem that it is impossible to distinguish between the A level and the B level in the case where the power is turned off or a write defect occurs during the writing from LM level to the B level as shown in FIG. 2D.

(BC-1st Mode)

In the BC-1st mode, the data of the lower page are written as shown in FIG. 3A. The lower page data are written in a lower middle (LM) level which is an intermediate level between the A level which is a final write level and the B level.

In the writing in the upper page, a threshold voltage is firstly shifted from the LM level to the B level in the case where the data of the lower page L is "0" and the data of the upper page U is "1" as shown in FIG. 3B, while the threshold voltage is shifted from the LM level to the C level in the case where the data of the lower page L is "0" and the data of the upper page U is "0".

As shown in FIG. 3C, the threshold voltage is shifted from the E level to the A level in the case where the data of the lower page L is "1" and the data of the upper page U is "0".

The BC-1st mode is a writing method with higher reliability as compared to the C-1st mode since it is capable of preventing a threshold value distribution of the B level from overlapping with a threshold value distribution of the A level.

The write modes of the BC-1st mode and the C-1st mode are implemented to the NAND controller 18a, and switching between the BC-1st mode and the C-1st mode is enabled by a command supplied from the memory controller 11a.

First Embodiment

In the first embodiment, switching between BC-1st mode write and C-1st mode write is enabled by changing a command to be issued to a NAND flash memory 18 based on a command issued from a host device 20, so that destruction of data of a lower page is prevented, and prevention of slowdown of writing speed is enabled.

Figure 4:
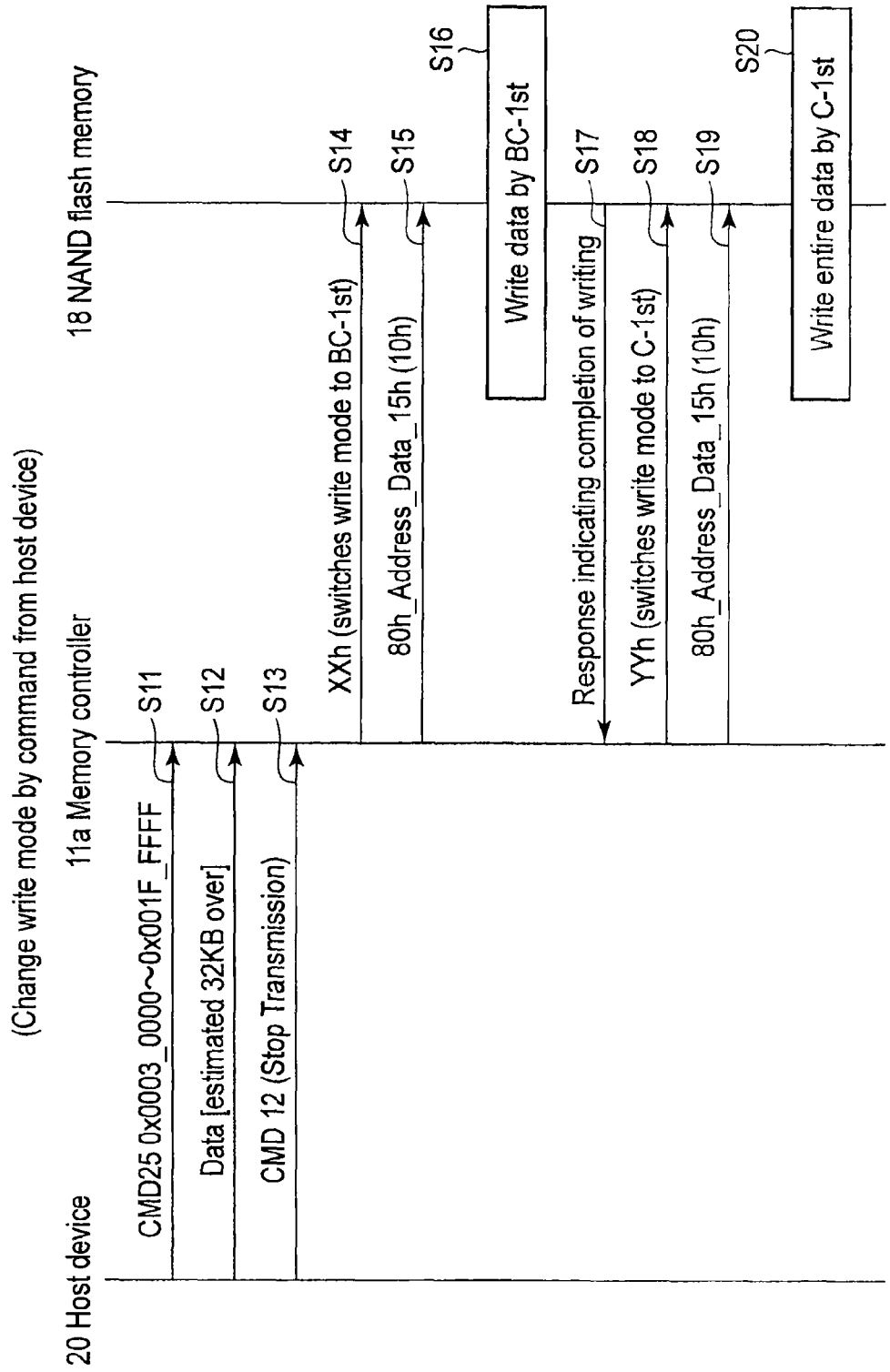
FIG. 4 is a diagram showing a sequence chart of a write operation according to a first embodiment.

Shown in FIG. 4 is the first embodiment.

In the first embodiment, an operation in the case where a memory controller 11a receives data of 32 KB or more by a command issued from the host device 20 and a command (CMD 25) indicating a multiple block write called a write-multiple-block command.

In this case, the command (CMD 25) indicating the multiple block write is issued from the host device 20, so that a write address is outputted (S11). Subsequently, the data of 32 KB or more are outputted (S12). After that, a command (CMD 12) indicating termination of data transfer is issued from the host device 20 (S13).

The memory controller 11a firstly issues a command (XXh) (h indicates hexadecimal notation) which designates the BC-1st mode write when the command (CMD 25) is issued from the host device (S14).

After that, the memory controller 11a issues a command (80h) indicating data load to the NAND flash memory 18, transfers a write address and data to the NAND flash memory 18, and then issues a write command (15h or 10h) (S15). Here, a data length to be transferred to the NAND flash memory 18 may be a length of the upper page in the case where the writing is from the upper page after the writing into the lower page is performed.

The NAND controller 18a writes the transferred data for one page to the NAND flash memory 18 by the BC-1st mode upon reception of the write command (15h or 10h) (S16).

More specifically, in the NAND flash memory 18, in the case where there is a lower page which is written before the reception of the write command, data are written from a corresponding upper page by the BC-1st mode. Thus, the data for one page are written by the BC-1st mode.

After completion of the writing, a response from the NAND flash memory 18 is sent to the memory controller 11a (S17).

Upon reception of the response, the memory controller 11a issues a command (YYh) which switches the write mode to the C-1st mode (S18).

After that, the memory controller 11a issues a command (80h) indicating data load to the NAND flash memory 18, transfers a next write address and next data to the NAND flash memory 18, and then issues a write command (15h or 10h) (S19).

The NAND controller 18a writes the next data into the NAND flash memory 18 by the C-1st mode in accordance with the write command (15h or 10h) (S20).

Thereafter, the NAND controller 18a writes a rest of the data transferred from the host device 20 to the memory controller 11a into the NAND flash memory 18 by the C-1st mode.

Shown in FIG. 13 is one example of physical sector of the NAND flash memory 18. As shown in FIG. 13, in the case of storing 2-bit data in a memory cell, each of sectors is formed of a lower page (L) and an upper page (U).

Further, in order to suppress influence of capacitance coupling of the adjacent memory cells, an order of writing in the lower page (L) and the upper page (U) in each of the sectors is as follows as indicated by numbers in FIG. 13.

(0) Lower page of the first sector
(1) Lower page of the second sector
(2) Upper page of the first sector
(3) Lower page of the third sector
(4) Upper page of the second sector
(5) Lower page of the fourth sector
(6) Upper page of the third sector
(7) Lower page of the fifth sector
. . .

In the case where writing is interrupted in a state where data are written into the lower page of the second sector (1) in accordance with the above-described writing order, data are not yet written into the upper page of the second sector (4). In the case where the writing is restarted in such state, the data are written into the upper page of the second sector (4) by the BC-1st mode. After that, the data are written into the lower page of the fourth sector (5) and then into the upper page of the third sector (6) by the C-1st mode.

Further, in the case where the writing is interrupted in a state where the data are written into the lower page of the third sector (3) shown in FIG. 13, the data are not written into the upper page of the second sector (4) and the upper page of the third sector (6). Therefore, there is a fear that the data of the lower page of the second sector are destructed when writing the data into the upper page of the second sector (4).

In this case, accordingly, the data are written into the upper page of the second sector (4), the lower page of the fourth sector (5), and the upper page of the third sector (6) by the BC-1st mode, and the data may be written into the pages after the upper page of the third sector (6) by the C-1st mode.

According to the first embodiment, when the data are written into the NAND flash memory 18, the writing is performed by designating the BC-1st mode by the command (XXh), and, after that, the writing is performed by designating the C-1st mode by the command (YYh). Therefore, in the case of starting data writing from the upper page when data has been written into the lower page before the issuance of the write command, for example, it is possible to prevent destruction of the lower page since the data are into the upper page by the high reliability BC-1st mode.

Further, the rest of the data are written by switching to the C-1st mode having the faster writing speed than the BC-1st mode after the data writing by the BC-1st mode is performed. Therefore, high speed data writing is realized.

First Embodiment, First Modification Example

Shown in FIG. 5 is a first modification example of the first embodiment.

The first modification example is the case in which a request for reliable write is issued from the host device 20.

In this case, a command indicating the request for reliable write (CMD 23 0x8000_****) is issued from the host device 20, for example, as shown in FIG. 5 (S21).

Subsequently, a command (CMD 24) indicating single block write is issued (S22), and data are outputted (S23).

Alternatively, a command indicating the request for reliable write (CMD 23 0x8000_****) is issued from the host device 20, for example, as shown in FIG. 5 (S21), and then a command (CMD 25) indicating multiple block write is issued (S24), followed by data output (S23).

Upon reception of the command indicating request for reliable write (CMD 23 0x8000_****), the memory controller 11a issues a command (XXh) which designates the highly reliable BC-1st mode to the NAND flash memory 18 (S25).

Subsequently, the memory controller 11a issues a data load command (80h) to the NAND flash memory 18, transfers a write address and data to the NAND flash memory 18, and then issues a write command (15h or 10h)(S26).

The NAND controller 18a writes data into the NAND flash memory 18 by the BC-1st mode in accordance with the write command (15h or 10h) (S27).

According to the first modification example, in the case where the command (CMD 23) indicating request for reliable write is issued from the host device 20, the memory controller 11a issues the command (XXh) which designates the BC-1st mode, and the NAND flash memory 18 writes the entire data by the BC-1st mode. Therefore, the writing of the entire data by the highly reliable BC-1st mode is enabled.

First Embodiment, Second Modification Example

Figure 6:
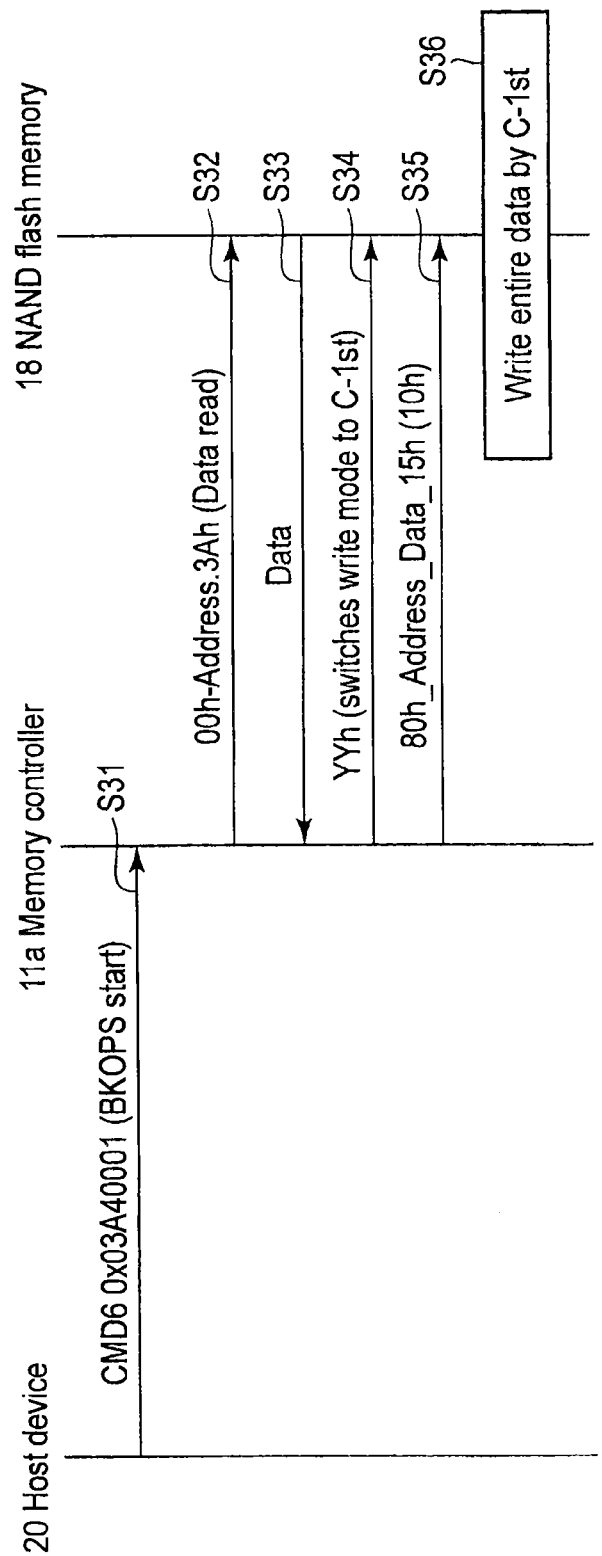
FIG. 6 is a diagram showing a sequence chart of a write operation according to a second modification example of the first embodiment.

Shown in FIG. 6 is a second modification example of the first embodiment.

The second modification example is an operation in the case where data in the NAND flash memory 18 are copied or moved by a background operation (BKOPS).

For example, in the case where data in the NAND flash memory 18 are copied or moved in a background operation such as defragment and garbage collection, the data in the NAND flash memory 18 are temporarily read out to be retained in the buffer 16. The data retained in the buffer 16 are written into a predetermined address of the NAND flash memory 18. Since the source data remain in the NAND flash memory 18 unless they are erased, the data are restorable. Therefore, it is unnecessary to employ the reliable write mode, but rather high speed copy or move is preferred. Accordingly, the C-1st mode which is capable of high speed writing is employed for the copy or move processing.

As shown in FIG. 6, in the case where a command (CMD 6) instructing the background operation and a parameter 0x3A40001 (BKOPS start), for example, are issued from the host device 20 (S31), the memory controller 11a issues a command (00h_address_3Ah) indicating data read (S32).

When the read command is received, the NAND flash memory 18 reads data from the designated address and transfers the data to the memory controller 11a (S33).

Subsequently, the memory controller 11a issues a command (YYh) designating the C-1st write (S34). After that, the memory controller 11a issue a data load command, an address, data, and a write command (80h_adress_data__15h (or 10h)) (S35).

When the write command is received, the NAND flash memory 18 writes the entire data retained in the buffer into the designated address by the C-1st mode (S36).

According to the second modification example, in the case where the command instructing the background operation such as defragment and garbage collection in which the source data remain is issued from the host device 20, the memory controller 11a writes the data into the NAND flash memory 18 by the C-1st mode. Therefore, the high speed copy or move processing is enabled.

Second Embodiment

In the first embodiment, switching between the write modes in the NAND flash memory 18 is performed by the memory controller 11a based on the command issued from the host device 20.

In contrast, in the second embodiment, a host device 20 previously sets a plurality of partitions of which attributes are varied from one another in a NAND flash memory 18, and, in the case where a command for writing in any one of the set partitions is issued from the host device 20, a memory controller 11a performs the switching between the write modes in the NAND flash memory 18 based on the attribute of the set partition.

Figure 7:
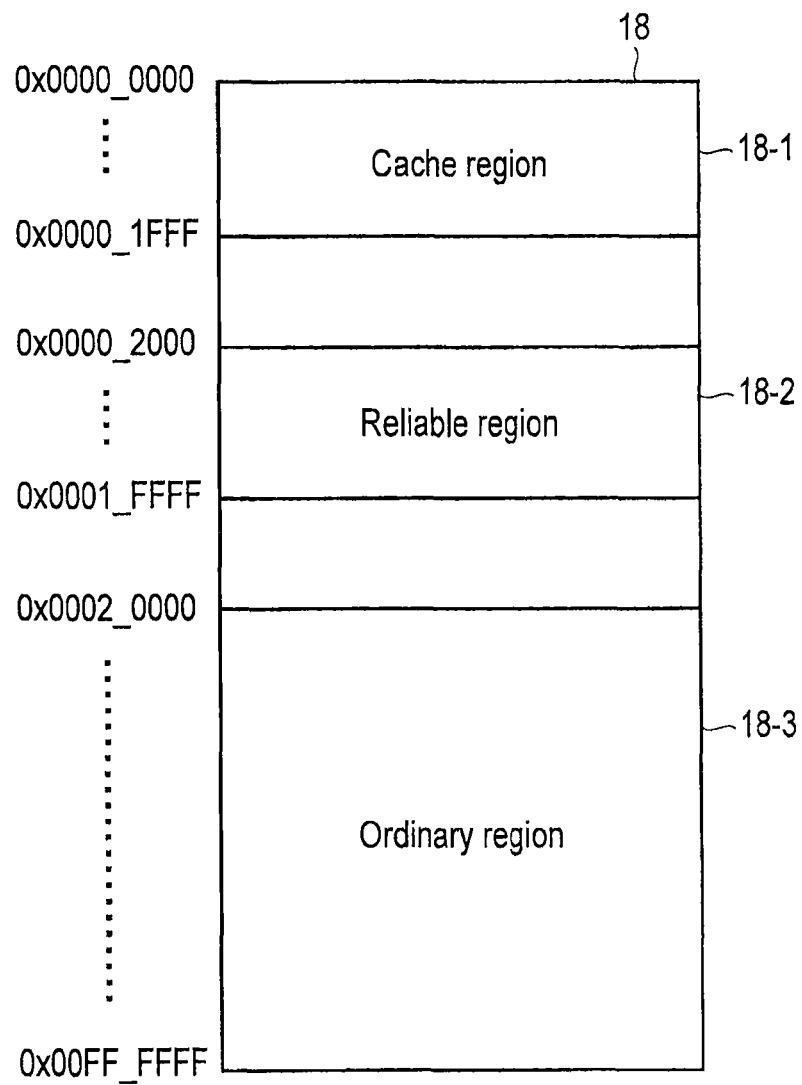
FIG. 7 is a diagram showing one example of partitions which are set in a NAND flash memory according to a second embodiment.

Shown in FIG. 7 is one example of the attributes of the partitions which are set by the host device 20 in the NAND flash memory 18.

In FIG. 7, among addresses (logical addresses) of the NAND flash memory 18, "0x0000_0000" to "0x0000_1FFF" are set in a cache region 18-1; "0x0000_2000" to "0x0001_FFFF" are set in a reliable region (data reliability) 18-2; and "0x0002_0000" to "0x00FF_FFFF" are set in an ordinary region 18-3.

Figure 8:
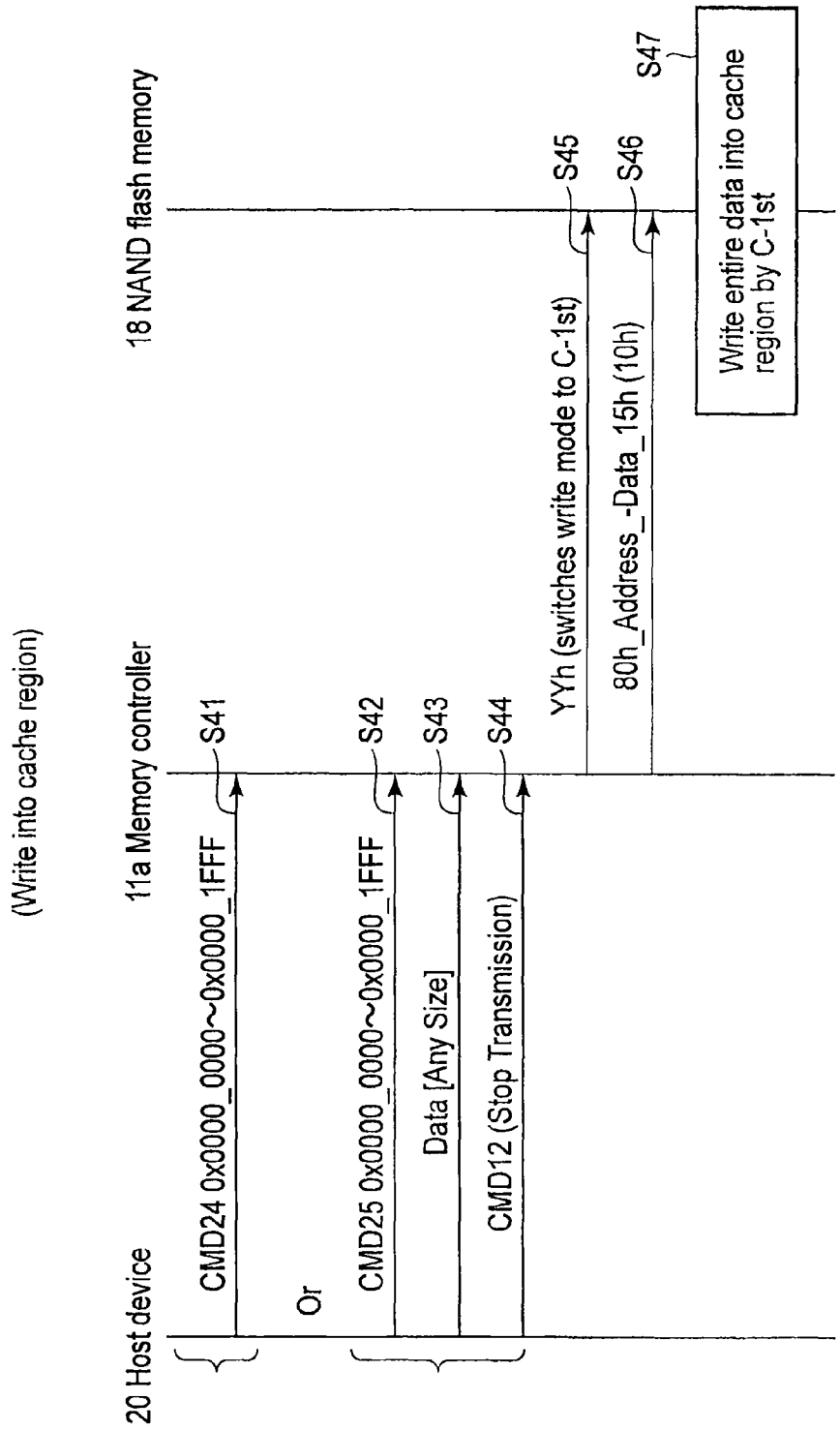
FIG. 8 is a diagram showing a sequence chart of a write operation according to the second embodiment.

Shown in FIG. 8 is an operation in the case where a command (CMD 24) indicating single block write or command (CMD 25) indicating multiple block write into the cache region 18-1 is issued from the host device 20 in a state where the partitions are set in the NAND flash memory 18 as described above.

Data which may be erased when the power is disconnected are written into the cache region 18-1. Accordingly, a writing speed is recognized more important than writing accuracy. Therefore, the C-1st mode by which the writing is completed in a short time is employed irrespective of the size of the data.

More specifically, in the case where the command (CMD 24) for single block write and the write addresses ("0x0000_0000" to "0x0000_1FFF") to the cache region 18-1 are issued by the host device 20 (S41) or in the case where the command (CMD 25) for multiple block write and the write addresses ("0x0000_0000" to "0x0000_1FFF") to the cache region 18-1 are issued from the host device 20 (S42), followed by output of data (S43) and, further, issuance of a command (CMD12) indicating termination of data transfer from the host device 20 (S44), the memory controller 11a issues a command (YYh) designating the C-1st write mode to the NAND flash memory 18 (S45).

After that, the memory controller 11a issues a data load command, an address, data, and a write command (80h_adress_data__15h (or 10h)) (S46).

The NAND flash memory 18 writes the data supplied from the memory controller 11a by the C-1st mode in accordance with the supplied command into the cache region 18-1 (S47).

Second Embodiment, Modification Example

Figure 9:
FIG. 9 is a diagram showing a sequence chart of a write operation according to a modification example of the second embodiment.

Shown in FIG. 9 is a modification example of the second embodiment. The modification example is an operation in the case where a command (CMD 24) indicating single block write into the reliable region 18-2 of the NAND flash memory 18 or a command (CMD 25) indicating multiple block write into the reliable region 18-2 of the NAND flash memory 18 is issued from the host device 20.

The reliable region 18-2 is a region where destruction of data of a lower page is always not allowed irrespective of absence/presence of a request for reliable write. Accordingly, reliability is recognized more important than a writing speed. Therefore, the BC-1st as the highly reliable write is employed irrespective of the size of the data.

More specifically, in the case where data are to be written into the reliable region 18-2, a single block write command (CMD 24) and write addresses ("0x0000_2000" to "0x0001_FFFF") to the reliable region 18-2 are issued from the host device 20 (S51).

Alternatively, a multiple block write command (CMD 25) and write addresses ("0x0000_2000" to "0x0001_FFFF") to the reliable region 18-2 are issued from the host device 20 (S52), followed by data output (S53) and, further, issuance of a command (CMD 12) indicating termination of data transfer from the host device 20 (S54).

In the case where the command indicating data write into the reliable region 18-2 is issued, the memory controller 11a issues a command (XXh) designating the BC-1st mode write to the NAND flash memory 18 (S55).

After that, the memory controller 11a issues a data load command, an address, data, and a write command (80h_adress_data__15h (or 10h)) (S56).

The NAND flash memory 18 writes the data supplied from the memory controller 11a by the BC-1st mode in accordance with the supplied command into the reliable region 18-2 (S57).

In the case where a write command to the ordinary region 18-3 is issued from the host device 20, the memory controller 11a writes data after switching between the BC-1st mode and the C-1st mode by the command in the same manner as in the first embodiment shown in FIG. 4.

According to the second embodiment, in the case where the partitions of different attributes such as the cache region (18-1), the reliable region (18-2), and the ordinary region (18-3) are set in the NAND flash memory 18, the memory controller 11a issues the command designating the write mode according to the attribute of the partition to the NAND flash memory 18 when the write command designating any one of the partitions is issued by the host controller 20. Therefore, since the NAND flash memory 18 is capable of writing data by the write mode according to the attribute of the partition, the NAND flash memory 18 is capable of performing the optimum write operation in accordance with the request from the host device 20. Therefore, the writing speed or the write reliability is maintained.

Third Embodiment

In the second embodiment, the write operations to the partitions in the case where the partitions having different attributes are set in the NAND flash memory 18 are described.

In contrast, as the third embodiment, a write control method in the case where the condition such as the partition and the command for selecting the write mode does not exist will be described.

The memory controller 11a cannot previously acquire a quantity of data to be received until issuance of a command (CMD 12) after issuance of a multiple block write command (CMD 25), for example. Therefore, write performance is sometimes improved when the write modes are switched therebetween based on estimation of the data quantity.

Accordingly, in the third embodiment, the memory controller 11a stores history information formed of a logical address and a data size as an access pattern of past designation by the host device 20 and issues a command which designates a write mode based on the history information to the NAND flash memory 18.

Shown in FIGS. 10A and 10B are history information of the logical addresses and data sizes which are designated by the host device 20 and are stored by the memory controller 11a. The history information is formed in such a manner that information generated when the host device 20 issues a write commands, for example, to the memory controller 11a is stored by the memory controller 11a. The history information is stored in a not-shown control region of the NAND flash memory 18, for example, when power of a memory device 11 is turned off and is read out from the control region to be transferred to a RAM 15 when the power of the memory device 11 is turned on.

Shown in FIG. 10A is frequency of the case in which a write size of a command (CMD 25) issued from the host device 20 to the memory controller 11a is 64 KB or less in the address space "0x0000_0000" to "0x00FF to FFFF" of 8 Mb.

Shown in FIG. 10B is frequency of the case in which a write size of a command (CMD 25) issued from the host device 20 to the memory controller 11a is larger than 64 KB.

As shown in FIG. 10A, in the case where there is a deviation to the small size multiple block write in the accesses from the host device 20, an overhead occurs when writing is performed by switching between the BC-1st mode and the C-1st mode. Therefore, only the BC-1st mode is employed for writing in the case where there is the deviation to the small size multiple block write in the accesses from the host device 20.

Further, in the case where there is a deviation to the large size multiple block write in the accesses from the host device 20 as shown in FIG. 10B, long time is required for writing in the case where the writing is performed only by the BC-1st mode. Therefore, switching between the BC-1st mode and the C-1st mode is performed for the writing in the case where there is the deviation to the large size multiple block write in the accesses from the host device 20.

Shown in FIG. 11 is a write sequence in the case where there is the deviation to the small size multiple block write in the accesses from the host device 20.

A multiple block write command (CMD 25) and write addresses of 64 KB or less ("0x0000_0000" to "0x0001_FFFF") are issued from the host device 20 (S61), followed by data output (S62) and, further, issuance of a command (CMD 12) indicating termination of data transfer from the host device 20 (S63).

In this case, the memory controller 11a determines the small size multiple block write based on the write addresses and the history information (S64) and issues a command (XXh) designating the BC-1st mode write to the NAND flash memory 18 (S65).

After that, the memory controller 11a issues a data load command, an address, data, and a write command (80h_adress_data__15h (or 10h)) (S66).

The NAND flash memory 18 writes the data supplied from the memory controller 11a by the BC-1st mode in accordance with the supplied command (S67).

Figure 12:
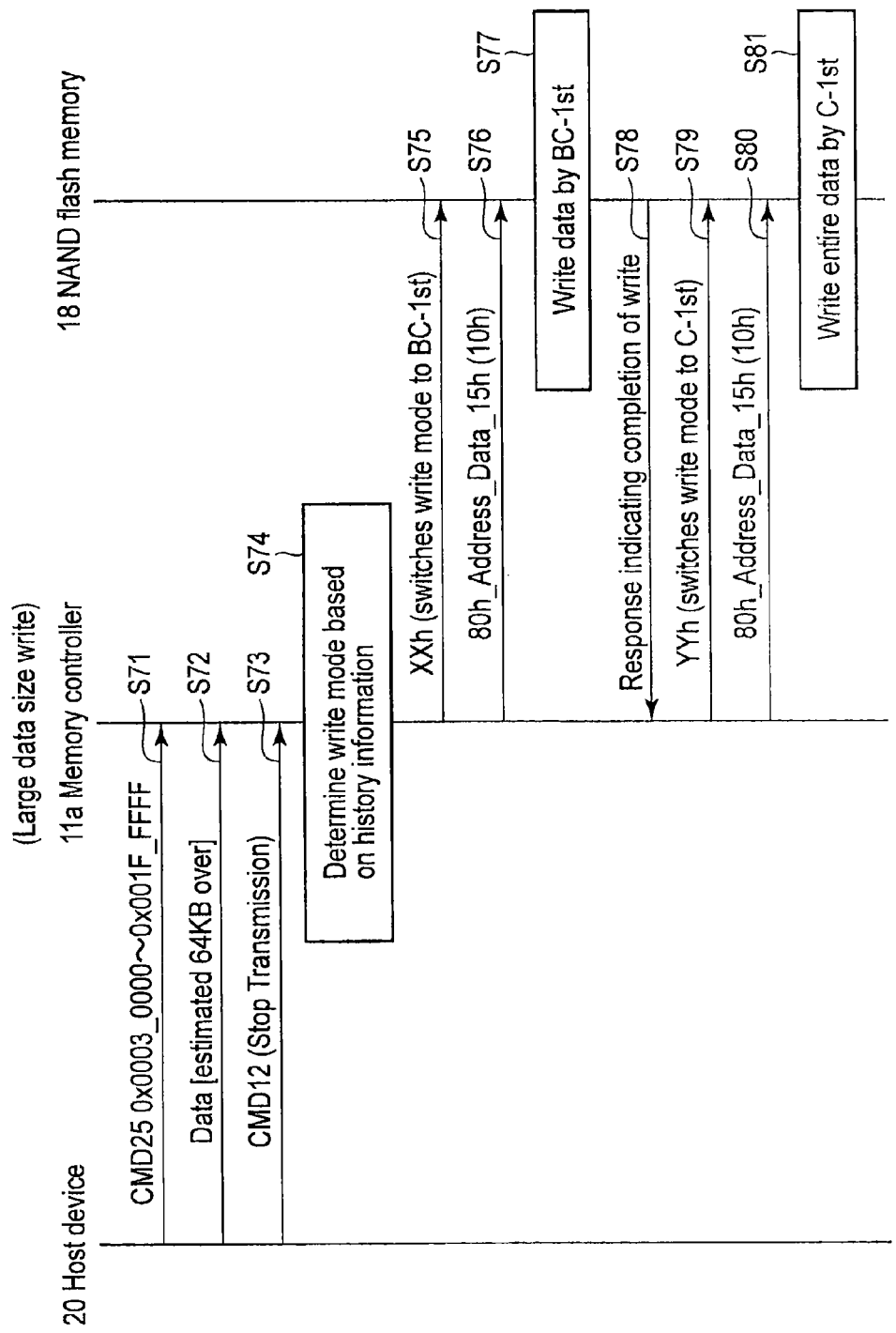
FIG. 12 is a diagram showing a sequence chart of a write operation according to the third embodiment.

Shown in FIG. 12 is a write sequence in the case where there is the deviation to the large size multiple block write in the accesses from the host device 20.

A multiple block write command (CMD 25) and write addresses of more than 64 KB ("0x0003_0000" to "0x001F_FFFF") are issued from the host device 20 (S71), followed by data output (S72) and, further, issuance of a command (CMD 12) indicating termination of data transfer from the host device 20 (S73).

In this case, the memory controller 11a determines the large size multiple block write based on the write addresses and the history information (S74) and issues a command (XXh) designating the BC-1st mode write to the NAND flash memory 18 (S75).

After that, the memory controller 11a issues a data load command, an address, data, and a write command (80h_adress_data__15h (or 10h)) (S76).

The NAND flash memory 18 writes the data supplied from the memory controller 11a by the BC-1st mode in accordance with the supplied command (S77).

In the case where there is a lower page in which writing is performed before the reception of the above-described write command in the NAND flash memory 18, data are written from a corresponding upper page by the BC-1st mode. Thus, all of the transferred data are written by the BC-1st mode.

When the writing is completed, a response is sent from the NAND flash memory 18 to the memory controller 11a (S78).

Upon reception of the response, the memory controller 11a issues a command (YYh) which switches the write mode to the C-1st mode (S79).

After that, the memory controller 11a issues a data load command, an address, data, and a write command (80h_adress_data__15h (or 10h)) to the NAND flash memory 18 to give an instruction to write the rest of the data.

The NAND controller 18a writes the rest of the data by the C-1st mode in accordance with the write command (15h or 10h) (S81).

According to the third embodiment, the controller 11a stores the history information of the access pattern of the host device 20; determines whether or not the write mode should be switched based on the write addresses and the history information in the case where the command (CMD) indicating the multiple block write is issued from the host device; and performs only the BC-1st mode write in the case where the data size is small; or performs the BC-1st mode write in the case where the data size is large and then switches to the C-1st mode. Therefore, it is possible to prevent decreasing the writing speed when the data size is small, while it is possible to prevent destruction of the lower page as well as to prevent decreasing writing speed in the case where the data size is large.

The case of storing 2 bits in a memory cell and storing quaternary data is described in the foregoing embodiments. However, the case is not limitative, and the embodiments are applicable to the case of storing 3 bits in a memory cell and storing octal data and to the case of storing 4-bit hexadecimal data.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
    memory cells including at least a first memory cell, a second memory cell, a third memory cell, and a fourth memory cell;
    a first controller shifting threshold levels of the memory cells to four voltage levels (first voltage level<second voltage level<third voltage level<fourth voltage level) based on first and second data;
    the first controller comprising (i) a first write mode for shifting a threshold level of the second memory cell to the second voltage level and a threshold level of the third memory cell to the third voltage level after shifting a threshold level of the fourth memory cell to the fourth voltage level based on the second data and (ii) a second write mode for shifting a threshold level of the third memory cell to the second voltage level after shifting a threshold level of the third memory cell to the third voltage level and a threshold level of the fourth memory cell to the fourth voltage level; and
    a second controller configured to issue at least one of first and second commands to be supplied to the first controller in order to select at least one of the first and second write modes.

2. The system according to claim 1, wherein
    when a third command which designates writing of the first data from a host device is received, the second controller issues the second command which designates the second write mode to the first controller; issues a fourth command for writing a part of the first data to the first controller; issues the first command which designates the first write mode to the first controller after completion of the writing; and issues a fifth command for writing a rest of the first data to the first controller.

3. The system according to claim 1, wherein
    the second controller issues the second command which designates the second write mode and supplies the command to the first controller when a sixth command which designates a reliable write from a host device is received.

4. The system according to claim 1, wherein
    the second controller issues the first command which designates the first write mode and supplies the command to the first controller when a seventh command which designates copy or move of data stored in the memory unit from a host device is received.

5. The system according to claim 1, wherein
    the memory unit comprises a plurality of partitions having different attributes; and
    the second controller issues at least one of the first command which designates the first write mode and the second command which designates the second write mode and supplies at least one of the first command and the second command to the first controller when an eighth command which is supplied from a host device and designates writing to one of the partitions is received.

6. The system according to claim 5, wherein
    one of the partitions is a cache region; and
    the second controller issues the first command which designates the first write mode and supplies the command to the first controller when a ninth command which designates writing into the cache region from the host device is received.

7. The system according to claim 6, wherein
    one of the partitions is a reliable region having high reliability; and
    the second controller issues the first command which designates the first write mode and supplies the command to the first controller when a tenth command which designates writing into the reliable region from the host device is received.

8. The system according to claim 1, wherein
    the second controller stores an access pattern of a host device as history information; and
    when an eleventh command from the host device is issued, the second controller issues at least one of the first command which designates the first write mode and the second command which designates the second write mode based on the history information and supplies the command to the first controller.

9. The system according to claim 8, wherein
    the second controller issues the second command which designates the second write mode when it is determined that a write request supplied from the host device is for a small size write based on the history information and supplies the command to the first controller.

10. The system according to claim 8, wherein
    the second controller issues the second command which designates the second write mode when it is determined that a write request supplied from the host device is for a large size write based on the history information and issues the first command which designates the first write mode when a response which indicates completion of writing a second page corresponding to a first page from the first controller is received.

11. A memory system comprising:
    a first memory cell for storing a first bit and a second bit;
    a second memory cell for storing a third bit and a fourth bit;
    a third memory cell for storing a fifth bit and a sixth bit;
    a fourth memory cell for storing a seventh bit and an eighth bit;
    a first controller configured to write the first to eighth bits to the first to the fourth memory cells in a selected one of a first mode and a second mode; and
    a second controller configured to issue at least one of first and second commands in order to select one of the first and second write modes and to supply the command to the first controller,
    wherein the first controller executes a first write operation to write a first value to the first memory cell as the first bit, write the first value to the second memory cell as the third bit, write a second value which differs from the first value to the third memory cell as the fifth bit, and write the second value to the fourth memory cell as the seventh bit;
    wherein when the first mode is selected, the first controller executes a second write operation, after completion of the first write operation, to write the first value to the first memory cell as the second bit, and
    executes a third write operation, after completion of the second write operation, to write the second value to the second memory cell as the fourth bit and a fourth write operation, after completion of the second write operation, to write the first value to the third memory cell as the sixth bit, and the third operation and the fourth operation are executed; and wherein when the second mode has been selected, the first controller
executes the second write operation and the third write operation, after completion of the first write operation, and
executes the fourth write operation, after completion of the second write operation and the third write operation;
wherein the first bit, the third bit, the fifth bit, and the seventh bit belong to a first page; and
wherein the second bit, the fourth bit, the sixth bit, and the eighth bit belong to a second page.

12. The system according to claim 11, wherein
the second controller issues the second command which designates the second write mode to the first controller when a third command which designates to write first data from a host device is received; issues a fourth command for writing a part of the first data to the first controller after completion of the writing; issues the first command which designates the first write mode to the first controller; and issues a fifth command for writing a rest of the data to the first controller.

13. The system according to claim 11, wherein
the second controller issues the first command which designates the first write mode and supplies the command to the first controller when a sixth command which designates copy or move of data stored in a memory unit from a host device is received.

14. The system according to claim 13, wherein
the memory unit comprises a plurality of partitions having different attributes; and
the second controller issues at least one of the first command which designates the first write mode and the second command which designates the second write mode and supplies at least one of the first command and the second command to the first controller when a seventh command which is supplied from the host device and designates writing to one of the partitions is received.

15. The system according to claim 14, wherein
one of the partitions is a cache region; and
the second controller issues the first command which designates the first write mode and supplies the command to the first controller when an eighth command which designates writing into the cache region from the host device is received.

16. The system according to claim 15, wherein
one of the partitions is a reliable region having high reliability; and
the second controller issues the first command which designates the first write mode and supplies the command to the first controller when a ninth command which designates writing into the reliable region from the host device is received.

17. The system according to claim 11, wherein
the second controller stores an access pattern of a host device as history information; and
when an tenth command from the host device is issued, the second controller issues at least one of the first command which designates the first write mode and the second command which designates the second write mode based on the history information and supplies the command to the first controller.

18. The system according to claim 17, wherein
the second controller issues the second command which designates the second write mode when it is determined that a write request supplied from the host device is for a small size write based on the history information and supplies the command to the first controller.

19. The system according to claim 17, wherein
the second controller issues the second command which designates the second write mode when it is determined that a write request supplied from the host device is for a large size write based on the history information and issues the first command which designates the first write mode when a response which indicates completion of writing a second page corresponding to a first page from the first controller is received.

20. The system according to claim 11, wherein the first value is 0 data, and the second value is 1 data.

* * * * *